(12) United States Patent
Joergensen et al.

(10) Patent No.: US 6,181,139 B1
(45) Date of Patent: Jan. 30, 2001

(54) METHOD AND APPARATUS FOR TESTING THE INSULATING ABILITY OF AN INSULATION ON AN ELECTRIC CONDUCTOR

(75) Inventors: Peter Joergensen, Horsens; Joergen Olesen, Aarhus C, both of (DK)

(73) Assignee: Dansk System Elektronik A/S, Horsens (DK)

( * ) Notice: Under 35 U.S.C. 154(b), the term of this patent shall be extended for 0 days.

(21) Appl. No.: 09/242,045

(22) PCT Filed: Aug. 8, 1996

(86) PCT No.: PCT/DK96/00336

§ 371 Date: Feb. 8, 1999

§ 102(e) Date: Feb. 8, 1999

(87) PCT Pub. No.: WO98/07039

PCT Pub. Date: Feb. 19, 1998

(51) Int. Cl.[7] ............................. G01R 31/08; G01N 27/60
(52) U.S. Cl. ............................. 324/455; 324/514; 324/515
(58) Field of Search ................................. 324/455, 513, 324/514, 557, 558, 515

(56) References Cited

U.S. PATENT DOCUMENTS 4,151,461 * 4/1979 Pontre ................................. 324/514

FOREIGN PATENT DOCUMENTS

| 209912 | 5/1984 | (DE) . |
| 209913B1 | 5/1984 | (DE) . |
| WO9005311 | 5/1990 | (WO) . |

* cited by examiner

*Primary Examiner*—Safet Metjahic
*Assistant Examiner*—Anjan K Deb
(74) *Attorney, Agent, or Firm*—Antonelli, Terry, Stout & Kraus, LLP

(57) ABSTRACT

A method and an apparatus for touch-free testing of the insulating ability of an electric insulation on an electric conductor, where the testing item (8), the conductor, continuously is moved between a system of testing electrodes (2, 4), where the electric current path to the surface of the testing item is established by means of ionized atmospheric air, ion cloud or corona, between the testing electrodes (2, 4), made by a high frequenced high voltage generator (14) with low effect, where the testing item (8) is moved through the center of the electrode system (2, 4), that defects in the insulation are determined by means of a D.C. voltage established in an electric serial connection with the ion cloud, so that insulation defects in the testing item (8) will cause an electric current through the electric charge carrier in the form of ions, and that the electric current is registered by a current measuring circuit (18).

21 Claims, 1 Drawing Sheet

METHOD AND APPARATUS FOR TESTING THE INSULATING ABILITY OF AN INSULATION ON AN ELECTRIC CONDUCTOR

BACKGROUND OF THE INVENTION

1. Field of the Invention

The present invention relates to a method for testing of the insulating ability and of an insulation on an electric conductor, such as an enameled wire or a cable, and of the type.

2. Description of the Prior Art

U.S. Pat. No. 3,413,541 discloses an apparatus, where the difference of voltage for the testing is established between the electric conductor and a mechanical arrangement with rolls; and from U.S. Pat. No. 2,488,578 it is furthermore known to use hanging chains to form connection to the conductor, which insulation has to be tested. Furthermore it is known to transfer the testing voltage to the conductor by means of metal balls or the like, through which the conductor is moved.

These methods have in common that an insulation defect on the conductor, for instance in the form of a crack or a hole, will be registered as a voltage flashover. The voltage has to be chosen so that it does not exceed the puncture voltage of the insulating material, but is larger than the puncture voltage in atmospheric air at the same distance as the thickness of the insulating material.

It is furthermore known to use a contact wheel, where the wire to be insulation tested extends in an angular notch along the periphery of the wheel. That is that puncture may only occur where the sides of the notch touch the wire. An arrangement, where the wheel is substituted by a conducting media, such as salt water or mercury, which is known from the description in Danish patent application No. 2281/88, does not have this defect; but causes pollution of the wire to an unacceptable degree, which requires a subsequent cleaning process. The liquid may be substituted by a metal powder or by metal balls. This will not cause pollution of the surface of the wire; but the surface of the wire may be damaged by grinding.

WO 90/05311 furthermore discloses a test method making use of a superimposed high A.C. voltage on the testing voltage, whereby a puncture may be obtained where the insulation layer is defective. This requires that the superimposed voltage is adjusted to a voltage between the puncture strength for air, or in this case a gas which ionizes easily, Argon, and for the measured insulating material. However, in this case ionizing only occurs if a defect in the insulation occurs.

DD-A-209 912 and DD-A-209 913 discloses a test method, where the conducting media also may be replaced by a sufficient quantity of electric charge carriers, ions, which over a suitable axial distance is arranged to surround the wire. Such an electric conducting cloud may be a plasma cloud, or ionized gaz. A plasma cloud generated by a lighted electric arc is capable of carrying an electric current, by ionizing of for instance a noble gas between the electrodes. An electric arc is aggressive, both towards the electrode materials, the insulating materials and in this connection the item tested, due to the very high temperature to maintain the arc, and thereby the ionizing. This results in unfavourable properties in he form of sporadic damage of the test item and the insulating material and poor durability of the electrodes. However the test method disclosed in DD-A-209 912 is simplified by obtaining a varying division of the supplied voltage and with it a potential displacement between the light arc and the test voltage by means of an ohmic voltage divider.

U.S. Pat. No. 4,151,461 discloses, that the ionizing also may be obtained by continuously discharging of sparks; but to secure continuous ionizing it requires high power, 150–800 watts at 100–600 Hz, and it therefore causes that the electrodes to be quickly worn down.

U.S. Pat. No. 3,263,165 furthermore discloses, that the ionizing of atmospheric air also may be provided by means of a radioactive isotope, which may establish a current through the atmospheric air. Due to environmental reasons is not expedient, and requires intensive maintenance.

EP-A-0 264 482 discloses the use of laserbeams to generate the charge carriers, and EP-A-0 367 379 furthermore discloses, that electron emitting materials, such as chemical compounds of barium or calcium may emit electrons—but only by heating to high temperatures.

The aforementioned six methods have the important advantage, that the insulating material and the wire are not touched mechanical, which is why there is neither wear, tearing or physical damage to the surface of the insulation. Hardening of the metal core of the item, which normally may happen by mechanical bending around rolls or the like, does not occur. Such hardening is very unfavorable such as, for example, copper wire for spools in electric machines etc.

SUMMARY OF THE INVENTION

The invention is a method for testing the insulating ability of the insulation on an electric conductor by means of a careful, touch-free manner by means of simple provisions to establish a sufficient quantity of electric charge carriers in the form of an ion cloud or corona to test quickly and effectively, whether the electric conductor is completely covered by a sufficient layer of insulating material, and thereby is capable of insulating for an electric voltage.

The method according to the invention is distinctive in that the ion cloud is established by a high frequency high voltage generator with low power, and that defects in the insulation are determined by means of a D.C. voltage established in an electric serial connection with the ion cloud, so that insulation defects in the testing item will cause an electric current through the electric charge carrier in the form of ions, and at the electric current is registered by a current measuring circuit. In a careful, touch-free manner and by means of simple provisions it hereby becomes possible currently—on-line—to establish a sufficient quantity of electric charge carriers in the form of an ion cloud or corona to test quickly and effectively, whether the electric conductor is completely covered by a sufficient layer of insulating material, and thereby is capable of insulating for electric voltage. It should be emphasized that—in order to avoid damaging heat protection of the test item—there is made use of high-frequency and high voltage with low power to establish a permanent corona between the testing electrodes.

The invention furthermore relates to an apparatus for use with the method according to the invention, which apparatus comprises a system of testing electrodes providing a central passage for a tested item, an electric conductor, so that the tested item may be moved continuously through the passage, a high-frequency high voltage generator with low power, being adapted to ionize the atmospheric air in the passage and form a permanent ion cloud or corona, a measuring voltage generator and a current measuring circuit, and wherein the measuring voltage generator forms a current path through the ion cloud or the corona to the surface of the tested item, if insulation defects may occur, as the current measuring circuit also is connected with the electric conductor of the tested item, and wherein the testing electrode system is provided as two sets of electrodes being alternatively placed in a circle around the passage for the tested item in such a manner, that the electrodes mutually are equally distributed along the circle that is by way of example mutually displaced 45°.

The apparatus according to the invention is furthermore with one set of the electrodes insulated from the other set of electrodes in such a manner that a permanent ion cloud or corona is formed because of the capacitive current generated by the voltage from the high voltage generator.

In an advantageous manner the insulating material between the set of electrodes is of such type (shape and material), that the ionizing does not cause puncture, sparks, but continuous discharges in the form of a permanent ion cloud or corona.

In order to optimize the effect of the preferably permanent ion cloud or corona the electrodes are provided so that only between the respective circuits a common current path is formed through the ionized atmospheric air in the form of an ion cloud or corona, so that the current from the measuring voltage generator may pass through the ion cloud or the corona via a hole in the insulation of the tested item and further through the metal conductor of the tested item connected with the current measuring circuit.

Appropriately the apparatus according to the invention is provided so that one set of electrodes consists of a metal coating on the inner side of a piece of pipe made from glass or ceramics, which piece of pipe is placed parallel with the passage for the tested item; while the other set of electrodes consists of electrode placed perpendicular to the passage and between first-mentioned set of electrodes.

BRIEF DESCRIPTION OF THE DRAWINGS

The invention is explained in more detail in the following with reference to the drawings, in which.

DESCRIPTION OF THE PREFERRED EMBODIMENTS

Figure 1:
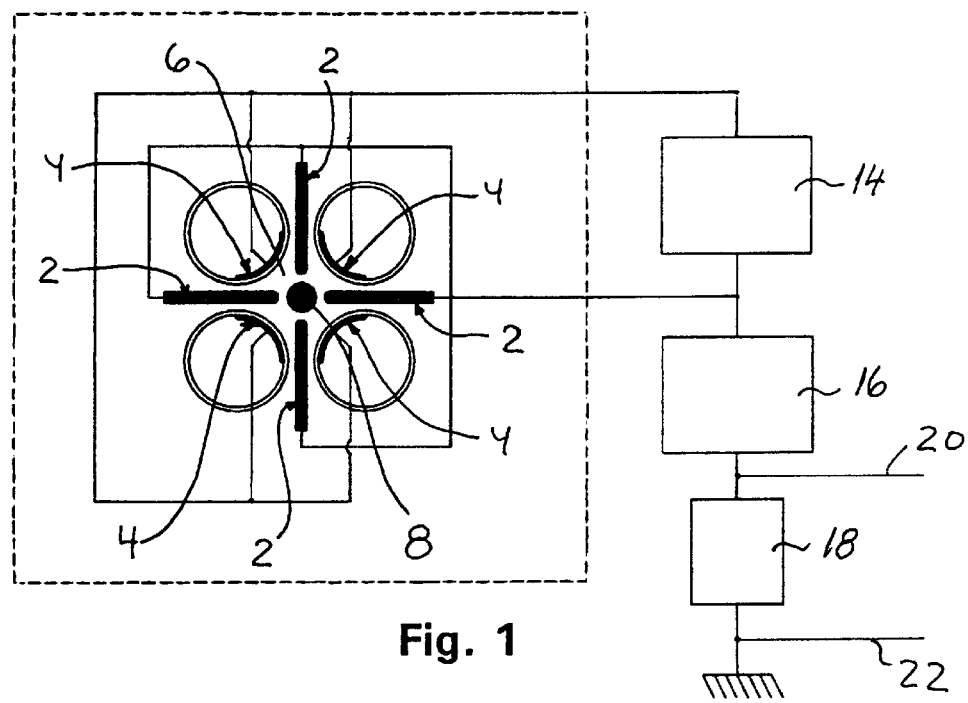
FIG. 1 shows a schematic sectional view seen from the side with a coupling diagram for an embodiment for an apparatus to be used by the method according to the invention.
Figure 2:
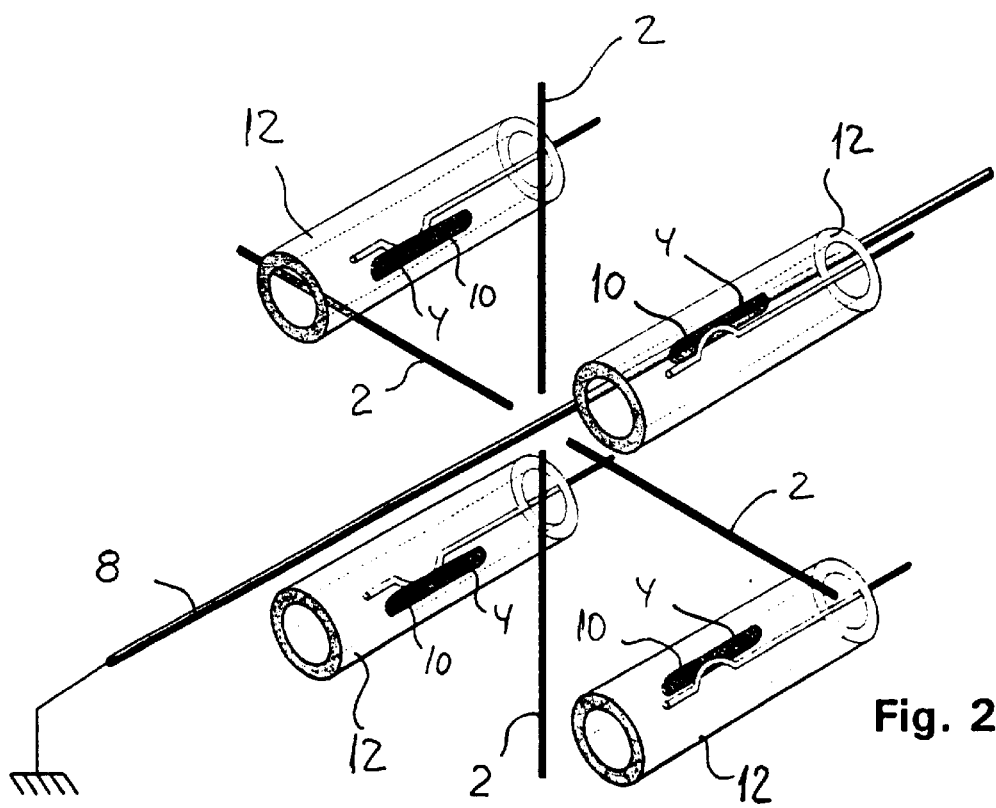
FIG. 2 shows a perspective exploded view of an embodiment of an arrangement of sets of electrodes of an apparatus according to the invention.

In the coupling diagram shown in FIG. 1 the apparatus of the invention comprises a set of electrodes 2 and a set of electrodes 4 each consisting of four electrodes arranged in a circle around a central passage 6 for a tested item 8, for instance an insulated electric conductor, which insulation coating is continuously tested, while the conductor is moved through the passage with suitable speed. The set of electrodes 2 consists of four thin cylindric electrodes being placed perpendicular to the tested item 8 in the passage 6 and mutually displaced 90° along the circle, causing an end part of the electrodes to be placed close to the central passage 6 of the tested item 8. The set of electrodes 4 consists of metal coatings 10 on the inside of tube pieces 12 made from glass or ceramics, functioning as the insulating material around the set of electrodes 4 having sufficient electric and mechanic expertise, such as the properties of glass or ceramic. In other words FIGS. 1 and 2 show two sets of electrodes with each of the four electrodes being mutually displaced 45° from each other.

As it furthermore appears from FIG. 1 there is by means of a high voltage A.C. generator 14 a high frequency and high voltage and lower power which is dependent on the electric properties of the material in question; but typically it will be about 60–100 KHz and 3–25 volts. By means of a measuring voltage generator 15, a measuring voltage is impressed, and by means of a current measuring circuit 18 any fault currents caused by holes in the insulation of the testing item 8 are detected, which tested item—as shown in FIG. 2—similar to the measuring circuit is connected to the apparatus frame. The measuring signal may be measured between the wires 20 and 22.

In other words the object of the invention is to utilize ionizing, which occurs by way of example in atmospheric air just before the electric field intensity in the air is high enough to make a puncture happen. This ionizing is described as corona. To maintain the continuous cloud of ions without a puncture occurring, the electrodes 2 and 4 are separated by an insulating material which is the tubes 12. The ionizing occurs continuously by means of a high A.C. voltage with a high frequency from the A.C. generator 14. The current of the corona is capacitively coupled with the insulating material 12 functioning as a dielectric. Since capacitively coupled current and voltage are phase displaced 90° with a capacitive load, the heat generated mainly is caused only by the dielectric loss in the insulating material 12 of the system. For the same reason the power consumption is low, about 5 watts for the disclosed system of electrodes. The system of electrodes is in the embodiment described circumferentially oriented around the tested item 8, and the embodiment causes that the ionizing of the air to be sufficient around the whole diameter of the tested item to perform the testing. Alternatively, the system of electrodes may be carried out with the electrodes in line, whereby a plate placed on the insulation, or a foil over a metal roller may be tested.

The function of the apparatus is such that the tested item continuously is moved through the central passage 6 of the system of electrodes, and any insulation fault causes an electric current to flow as electric charge carriers in the form of ions. This is due to the fact that the atmospheric air within the set of electrodes 2 and 4 is made electrically conductive in the form of an ionized gas by means of an electric field intensity causing discharges with high frequency in the form of corona.

The embodiment of the electrodes insures that the ionized atmospheric air contains a sufficient quantity of ions in the center of the system of electrodes so that a detectable increase of current from the measuring voltage generator 16 may be detected by the the current measuring circuit 18, if the insulation of the item is defective.

The embodiment insures that there are two circuits, which alone have a common current path in the ionized atmospheric air, corona. Thereby only the current from the measuring voltage generator 16 will be able to run through the corona, via a hole in the insulation, and further through the conductor of the item, which is connected to the current measuring circuit 18 via the frame connection to the apparatus. If there are no holes in the insulation of the tested item a current path to the metal core of the item cannot be established because of the insulating material.

What is claimed is:

1. A method of touch-free testing of electrical insulation of an electrical conductor comprising:

continuously moving an insulated electrical conductor through an array of testing electrodes including at least one pair of spaced apart testing electrodes which are separated by a solid insulator extending along at least one of the at least one pair of spaced apart testing electrodes and the electrical conductor in a zone of testing which prevents puncture and sparking between the at least one pair of testing electrodes during testing of the electrical insulation of the electrical conductor;

producing with a voltage generator, which applies a voltage from the voltage generator to the array of testing electrodes, a continuous corona which contacts the moving electrical conductor;

causing an electrical current flow through any defects in the insulation and the continuous corona; and measuring the electrical current flow through the defects in the insulation and the corona.

2. An apparatus for touch-free testing of electrical insulation of an insulated electrical conductor comprising:

an array of testing electrodes having a passage through which the insulated electrical conductor passes during testing of the electrical insulation with at least one pair of spaced apart testing electrodes which are separated by a solid insulator extending along at least one of the at least one pair of spaced apart testing electrodes and the electrical conductor in a zone of testing which prevents puncture and sparking between the at least one pair of testing electrodes during testing of the electrical insulation of the electrical conductor;

a corona generator, coupled to the array of testing electrodes, which produces corona that continuously contacts the insulated electrical conductor when the insulated electrical conductor is located in the passage;

a voltage generator which applies a voltage between a reference potential and the array of testing electrodes; and a current measuring device, coupled to the insulated electrical conductor, which measures current flow through the insulation and the corona caused by any defect in the insulation to indicate the presence of the defects.

3. An apparatus in accordance with claim 2 wherein the array of electrodes comprises:

two sets of testing electrodes, the two sets of testing electrodes being insulated from each other by a plurality of solid insulators with individual testing electrodes of the sets of testing electrodes being equally displaced from each with the insulated electrical conductor passing through a central passage therein during testing.

4. An apparatus in accordance with claim 3 wherein:

the two sets of testing electrodes are capacitively coupled to each other.

5. An apparatus in accordance with claim 4 wherein:

each set of testing electrodes are insulated from each other by the plurality of solid insulators which extend along the electrical conductor in the zone of testing which prevents puncture and sparking between the testing electrodes when the corona generator is activated.

6. An apparatus in accordance with claim 2 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

7. An apparatus in accordance with claim 6 wherein:

the electrode sets are disposed uniformly circumferentially around the insulated electrical conductor.

8. An apparatus in accordance with claim 3 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

9. An apparatus in accordance with claim 8 wherein:

the electrode sets are disposed uniformly circumferentially around the insulated electrical conductor.

10. An apparatus in accordance with claim 4 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

11. An apparatus in accordance with claim 10 wherein:

the electrode sets are disposed uniformly circumferentially around the insulated electrical conductor.

12. An apparatus in accordance with claim 5 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

13. An apparatus in accordance with claim 12 wherein:

the electrode sets are disposed uniformly circumferentially around the insulated electrical conductor.

14. An apparatus in accordance with claim 6 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

15. An apparatus in accordance with claim 14 wherein:

the electrode sets are disposed uniformly circumferentially around the insulated electrical conductor.

16. An apparatus in accordance with claim 7 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

17. An apparatus in accordance with claim 16 wherein:

the electrode sets are disposed uniformly circumferentially around the insulated electrical conductor.

18. An apparatus in accordance with claim 8 wherein:

each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

19. An apparatus in accordance with claim 18 wherein:
the electrode sets are disposed uniformly circumferentially around the insulated electrical conductor.

20. An apparatus in accordance with claim 9 wherein:
each testing electrode of one set of the testing electrodes comprises a metal coating on an inner side of a cylinder which is the solid insulator with the cylinder being parallel to the passage and the other set of electrodes are conductors extending outward from the passage and between the one set of the testing electrodes.

21. An apparatus in accordance with claim 20 wherein:
the electrode sets are disposed uniformly circumferentially around the insulated electrical conductor.

* * * * *